United States Patent [19]

Dicke

[11] Patent Number: 5,010,256
[45] Date of Patent: Apr. 23, 1991

[54] GATE OUTPUT DRIVER USING SLEW-RATE CONTROL

[75] Inventor: Curtis J. Dicke, Colorado Springs, Colo.

[73] Assignee: United Technologies Corporation, Hartford, Conn.

[21] Appl. No.: 313,193

[22] Filed: Feb. 21, 1989

[51] Int. Cl.<sup>5</sup> .......................... H03K 5/08; H03K 5/12; H03K 6/04
[52] U.S. Cl. ..................................... 307/263; 307/443; 307/491; 307/550
[58] Field of Search ............... 307/443, 491, 542, 550, 307/263, 264, 268, 576, 585

[56] References Cited

U.S. PATENT DOCUMENTS

| 4,129,792 | 12/1978 | Kawagai et al. | 307/270 |
| 4,216,393 | 8/1980 | Gillberg et al. | 307/270 |
| 4,394,588 | 7/1983 | Gaudenzi | 307/254 |
| 4,567,378 | 1/1986 | Raver | 307/270 |
| 4,622,482 | 11/1986 | Ganger | 307/585 |
| 4,634,893 | 1/1987 | Craycraft et al. | 307/270 |
| 4,727,266 | 2/1988 | Fujii et al. | 307/433 |
| 4,731,553 | 3/1988 | Van Lehn et al. | 307/443 |
| 4,760,279 | 7/1988 | Saito et al. | 307/443 |
| 4,777,389 | 10/1988 | Wu et al. | 307/443 |
| 4,779,013 | 10/1988 | Tanaka | 307/475 |
| 4,785,201 | 11/1988 | Martinez | 307/443 |
| 4,797,579 | 1/1989 | Lewis | 307/443 |
| 4,800,298 | 1/1989 | Yu et al. | 307/443 |

Primary Examiner—John Zazworsky

[57] ABSTRACT

An output driver for an integrated circuit reduces noise generation within the circuit by maintaining di/dt at a low value.

6 Claims, 3 Drawing Sheets

GATE OUTPUT DRIVER USING SLEW-RATE CONTROL

TECHNICAL FIELD

The field of the invention is that of output buffer designs for integrated circuits.

BACKGROUND ART

Many integrated circuits now employ as many as 300 to 400 input or output pins. In many cases, these outputs must be able to sink and source large amounts of current. With conventional circuit techniques, this results in large switching currents that can generate noise in internal components on the chip, contributing to errors.

The prior art has attempted to address this problem by sequentially turning on different output drivers in a timed sequence. An example is illustrated in FIG. 1, in which upper and lower inputs are turned on in sequence. In these sequential designs, the output transistors operate in the saturated region for only a short time and then change to the linear region resulting in a high rate of current change per unit time (di/dt). It is the di/dt which produces noise levels throughout the circuit by the voltage Vn=Ldi/dt induced in the circuit by the inductance between the metal interconnections and the bond wires. The art has long desired a circuit that would produce the required amount of output current with the minimum amount of noise, or maintaining the lowest possible value of di/dt.

DISCLOSURE OF INVENTION

The invention relates to an output control circuit in which the output transistors are maintained in a saturated current mode throughout most of the transition. In order to do this, a self-timed bias is applied to the gate of each output transistor during its switching time, so that the switching current is permitted to vary only slowly (i.e. di/dt is low) and the output driver is able to source or sink the required DC current.

Other features and advantages will be apparent from the specification and claims and from the accompanying drawings which illustrate an embodiment of the invention.

BEST MODE FOR CARRYING OUT THE INVENTION

Figure 1:
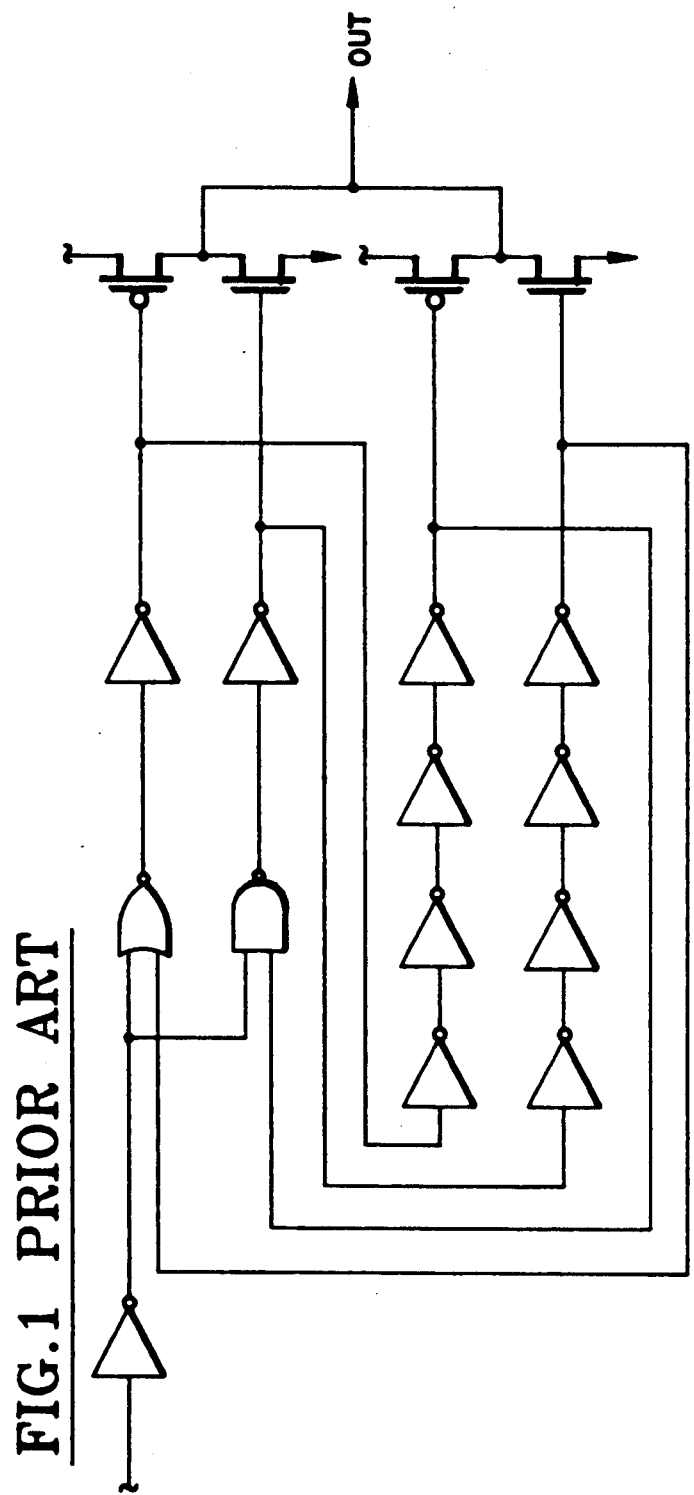
FIG. 1 illustrates a prior art device.
Figure 2:
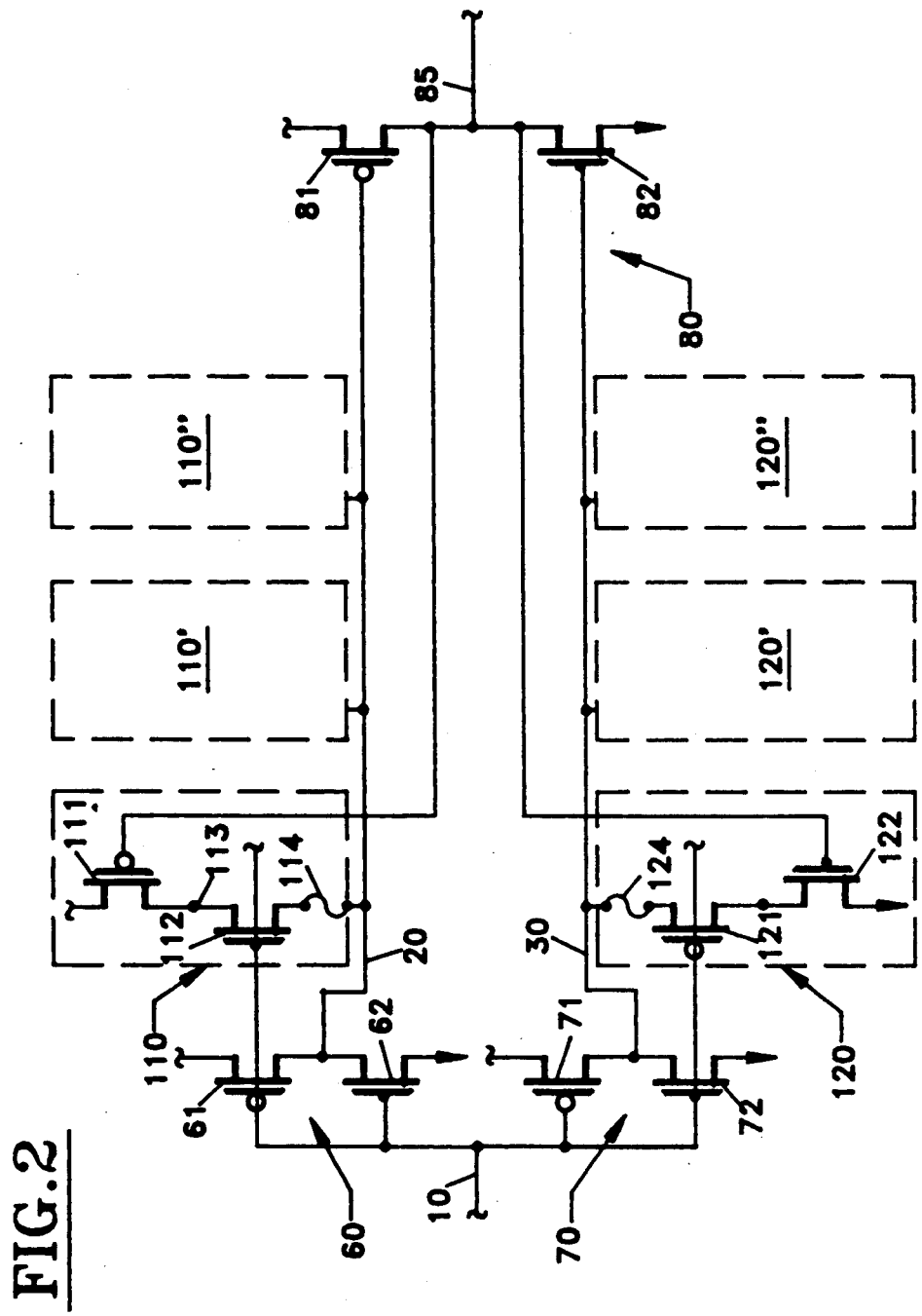
FIG. 2 illustrates a circuit according to the invention.
Figure 4:
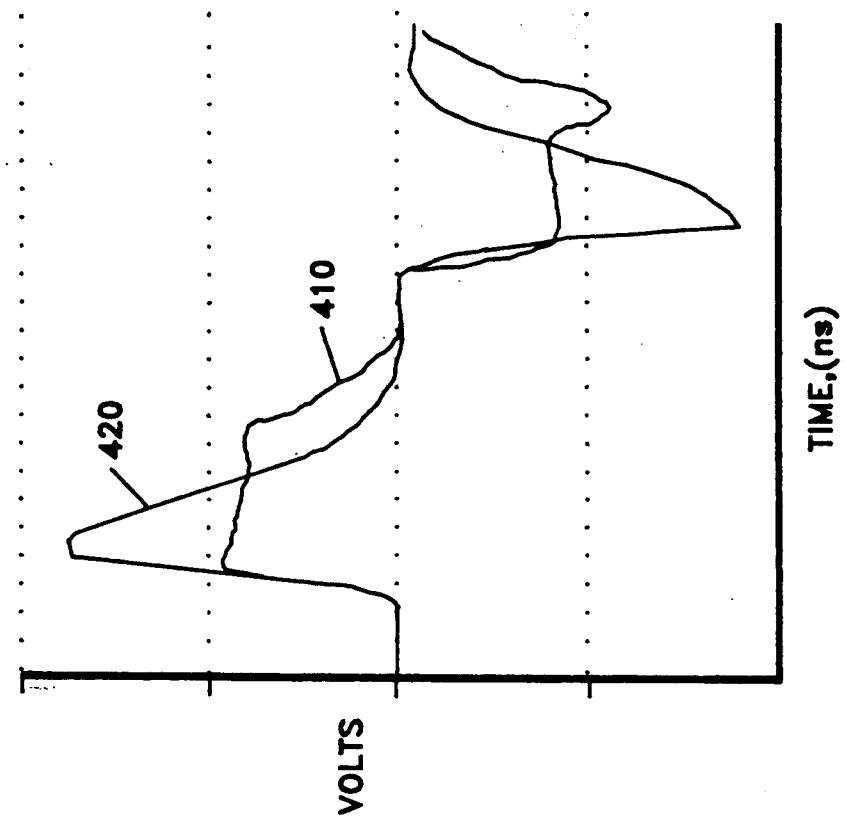
FIG. 4 illustrates a comparison of current in a prior art device and according to the invention.
Figure 3:
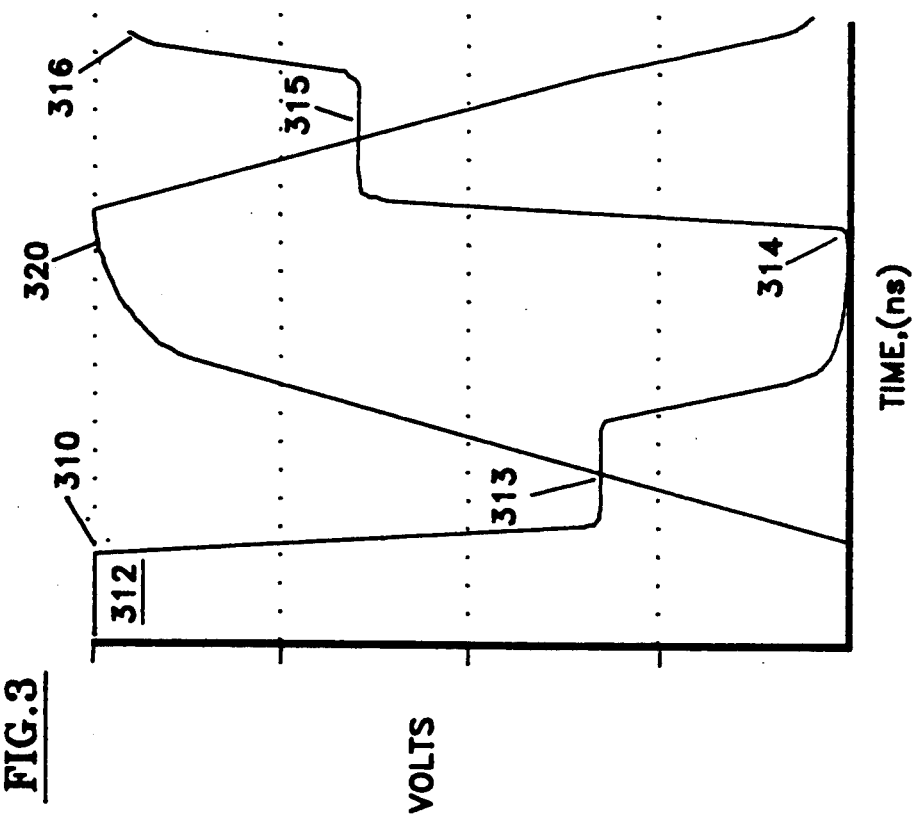
FIG. 3 illustrates the time dependence of current and voltage.

The results of this invention are illustrated in FIG. 3, in which line 310 illustrates the voltage on the gate of the P-channel transistor used in the output inverter. As can be seen, the voltage drops sharply from point 312 to a region 313 in which the voltage is maintained constant before it drops to the final value of zero. On the reverse transition from low to high, a similar sharp rise followed by a flat region 315 until the final rise to the logic one value at 316. The output on curve 320, reflecting node 85 of FIG. 2, shows a smooth rise from logic zero to logic one and then back again. FIG. 4 illustrates a curve of current verses time for a circuit constructed according to the invention in curve 410 and for a circuit constructed according to the prior art version of FIG. 1 in curve 420. As is readily apparent, there are two regions where the current changes vary slowly in the circuit of FIG. 2 compared to the rate of change in the circuit of FIG. 1. This small value of di/dt will produce a correspondingly small amount of noise in other circuit components.

Referring now to FIG. 2, there is illustrated an output buffer circuit according to the invention. The output inverter is denoted by the numeral 80 and consists of P-channel transistor 81 and N-channel transistor 82 with output node 85. The gates of transistors 81 and 82 are controlled by nodes 20 and 30 respectively, and the voltage on these nodes is controlled according to the invention. An input voltage is applied to node 10 and controls two inverters 60 and 70. Inverters 60 and 70 switch in conventional fashion to control nodes 20 and 30, respectively. Specifically, the voltage applied to node 10 controls transistors 61 and 62 of the inverter 60, and controls transistors 71 and 72 of the inverter 70. This voltage also controls transistor 114 of the bias circuit 110 and controls transistor 121 of the bias circuit 120. The bias on these nodes is modified in accordance with the invention to produce the results shown in FIGS. 3 and 4.

The bias on node 20, for example, is altered by the effect of a feedback loop from transistor 81 as is explained below. The value of the voltage on node 85 is applied to the gate of P-channel transistor 111. At the start of a 0 to 1 transition on node 85, node 113 will act as a virtual Vdd because transistor 111 is turned on hard. As node 85 increases from zero volts to the voltage of the logic one state, the voltage on the gate of transistor 111 will rise until it reaches the turn off value of transistor 111 which has an illustrative value of Vdd−0.7 volts, at which point, transistor 111 turns off. Prior to that time, there is a current path from Vdd through transistors 111 and 112, to node 20, and then down through transistor 62 to ground. The value of the voltage on node 20 will be set by the ratios of the impedances of transistors 112 and 62, so long as transistor 111 supplies a virtual source of Vdd. This ratio of transistor sizes is set illustratively to 3:1, so that the voltage on the gate of transistor 81 is maintained at a nominal value of 1.2 v, which maintains transistor 81 in saturation during most of the low to high transition. Node 10 is connected to the P-channel transistor 81 through transistor 61.

When transistor 111 is turned off, the voltage on node 20 is then pulled down to Vss by transistor 62. The change in voltage over time of node 20 is illustrated in curve 310 of FIG. 3, in which the voltage drops very sharply as the transistors switch and is then maintained through the action of transistors 112 and 62 at the essentially constant value (of 1.2 volts) indicated in region 313. When transistor 111 is turned off, at the end of the low to high output transition, then transistor 62 drives transistor 81 for the remainder of the period to point 314, at which time it applies the maximum drive of Vss on the gate of transistor 81 to establish the minimum impedance through transistor 81. With this arrangement, the AC current during the switching time is limited, and at the end of the transition, transistor 81 is able to source the large DC currents that are required of an output driver. The counterpart output voltage curve 320 indicates the smooth rise in voltage during the time when the bias in region 313 is effective, followed by a curved region of the voltage curve 320 until it reaches logic one.

During the same low to high transition illustrated in FIG. 3, node 3 will be falling from logic one to logic zero. Preferably, the transition on node 10 is much faster than on node 85, so that transistors 71 and 72 switch to hold node 30 low during the transition on node 85.

Correspondingly, transistors 121 and 71 provide a bias for transistor 82 during a high to low transition. Node 10 is connected to the N-channel transistor 82 through transistor 72.

In a transition, there will be a period when both transistors 81 and 82 are conducting, giving rise to the well known "crowbar" affect. To minimize this affect, transistor 61 is sized so that it will turn off transistor 81 during a high to low transition. Similarly, transistor 72 is sized so that it will quickly turn off transistor 82 in a low to high transition.

An additional feature of the invention is the presence of bias circuits 110' and 110" and counterparts 120' and 120". This feature provides a programmable bias voltage on node 20, resulting therefore in a programmable output slew rate. These optional devices will have transistors 112' and 112" sized to provide different voltages on node 20. Thus, the amount of the bias voltage may be changed by selecting which of the devices are to be active. Circuits 110 and 120 are shown as being connected to their respective gate nodes by fuse symbols 114 and 124. These symbols are referred to as programmable selection devices and represent a polysilicon strip that may be destroyed by a laser or by application of a high current, a transistor that may be turned on or off by tying its gate or by controllable application of a signal, or any other means of selecting which bias circuit is to be active. In one embodiment, in which there are enough pins on the package, the circuits may be controlled in real time by application of signals from an external source to transistors that do the selection.

The circuit has been illustrated without reference to the power supply voltage. It is assumed that Vdd is positive with respect to Vss. Vss may be at zero volts or at some negative voltage, with Vdd being at any convenient relatively positive voltage.

The circuit has been illustrated in an embodiment employing MOS transistors, but it can also be implemented with bipolar transistors. In that case, the P-channel transistors are replaced by PNP transistors and the N-channel transistors are replaced by NPN transistors. For convenience, in the claims that follow, the term "P-channel" is defined as meaning either a P-channel MOS transistor or a PNP bipolar transistor and the term "N-channel" is defined as meaning either an N-channel MOS transistor or an NPN bipolar transistor.

It should be understood that the invention is not limited to the particular embodiments shown and described herein, but that various changes and modifications may be made without departing from the spirit and scope of this novel concept as defined by the following claims.

What is claimed is:

1. A circuit for controlling the output of an integrated circuit to limit the rate of change of output current comprising:
   an output inverter having a P-channel output transistor having a P-gate and being connected between a positive power supply terminal and an output node and an N-channel output transistor having an N-gate and being connected between said output node and a negative power supply terminal;
   a first bias circuit connected to said P-gate and comprising a first P-channel bias transistor connected to said positive power supply terminal, a first N-channel bias transistor that is connected between said P-channel bias transistor and said first P-gate and a second N-channel bias transistor connected between said P-gate and said negative power supply terminal;
   a second bias circuit connected to said N-gate and comprising a second P-channel bias transistor connected to said N-gate, a third N-channel bias transistor connected between said second P-channel bias transistor and said negative power supply terminal, and a third P-channel bias transistor connected between said N-gate and said positive power supply terminal, in which;
   said output node is connected to a gate of said first P-channel bias transistor and to a gate of said third N-channel bias transistor; and
   said first and second N-channel bias transistors, and said second and third P-channel bias transistors are all controlled by an input node that is also connected to said P-gate and said N-gate.

2. A circuit according to claim 1, in which said second N-channel bias transistor is part of an inverter connected between said input node and said P-gate and in which said third P-channel bias transistor is part of an inverter connected between said input node and said N-gate.

3. A circuit according to claim 1, in which said first bias circuit further comprises at least two selectable upper stages, each having a predetermined impedance, connected in parallel between said positive power supply terminal and said P-gate, whereby the bias on said P-gate may be selected by the connection of a selected one of said at least two upper stages to said P-gate.

4. A circuit according to claim 1, in which said second bias circuit further comprises at least two selectable lower stages, each having a predetermined impedance, connected in parallel between said negative power supply terminal and said N-gate, whereby the bias on said N-gate may be selected by the connection of a selected one of said at least two lower stages to said N-gate.

5. A circuit according to claim 3, in which said first bias circuit is connected to said P-gate through a programmable selection device.

6. A circuit according to claim 4, in which said second bias circuit is connected to said N-gate through a programmable selection device.

* * * * *